(12) United States Patent
Eldridge

(10) Patent No.: US 6,479,308 B1
(45) Date of Patent: Nov. 12, 2002

(54) SEMICONDUCTOR FUSE COVERING

(75) Inventor: Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/034,608

(22) Filed: Dec. 27, 2001

(51) Int. Cl.[7] .............................................. H01L 21/66
(52) U.S. Cl. ............................ 438/14; 438/132; 438/15
(58) Field of Search ........................... 438/14, 132, 128, 438/125, 127, 467, 15

(56) References Cited

U.S. PATENT DOCUMENTS 4,628,590 A * 12/1986 Udo et al. ........... 148/DIG. 55
5,538,924 A * 7/1996 Chen .................... 148/DIG. 55
5,736,433 A * 4/1998 Bryant et al. ................ 438/130
2001/0034070 A1 * 10/2001 Damon et al. ................ 438/14

* cited by examiner

Primary Examiner—Tuan H. Nguyen
(74) Attorney, Agent, or Firm—Woodard, Emhardt, Naughton, Moriarty and McNett

(57) ABSTRACT

A method and system for sealing or covering exposed fuses on a semiconductor device are disclosed. A semiconductor device prober incorporating a spray device for applying a sealing compound to individual fuses on a semiconductor device subsequent to testing the semiconductor device is disclosed. A method and system for sealing exposed fuses on a semiconductor device is disclosed which allows the sealing step to be performed either prior to or following singulation of the semiconductor device into individual dice.

14 Claims, 8 Drawing Sheets

SEMICONDUCTOR FUSE COVERING

BACKGROUND OF THE INVENTION

The present invention relates generally to covering or sealing fuses of a semiconductor device.

As is known, many semiconductor dice are typically manufactured on a single semiconductor wafer. Once manufactured, the dice are typically subjected to a series of tests. These tests typically begin with initial gross functionality testing followed by more exacting testing, including, for example, burn-in testing. Typically, initial gross functionality tests are performed while the dice are in wafer form, and subsequent more exacting tests are performed on individual dice after they are singulated from the wafer. It should be noted, however, that the dice are sometimes subjected to the further testing while in wafer form. Often, although not always, the dice are packaged, at least partially, prior to some or all of the testing that follows the initial gross functionality testing.

Fuses may be formed on a semiconductor die that allows a defective circuit on the die to be replaced by a redundant or replacement circuit on the die. For example, fuses are often used on semiconductor memory die to replace a memory cell or column or row of memory cells found through testing of the die to be defective. Activation of a fuse disconnects the defective cell or column or row of cells and connects replacement cells, rows, or columns. A laser may be used to activate a fuse, which often involves cutting a fusible link on the die, but other fuse arrangements may be used.

Because dice are typically packaged before all testing of the dice has been completed, the fuses can only be used to replace defective circuits found during testing that occurs before packaging. This is because the packaging typically covers the fuses, making the fuses inaccessible after packaging has been applied. Even if the dice are not packaged or their packaging does not cover the fuses, the fuses nevertheless should be covered before the dice are used in their final applications to protect the fuses from environmental or other effects that might degrade the fuses and possibly cause the die to malfunction.

SUMMARY OF THE INVENTION

The invention is set forth in the claims below, and the following is not in any way to limit, define or otherwise establish the scope of legal protection. In general terms, the present invention relates to a method and system for covering or sealing exposed fuses on a semiconductor device. This covering or sealing may be accomplished either prior to or after a wafer is singulated into individual die components.

DETAILED DESCRIPTION OF EMBODIMENTS OF THE INVENTION

Figure 1:
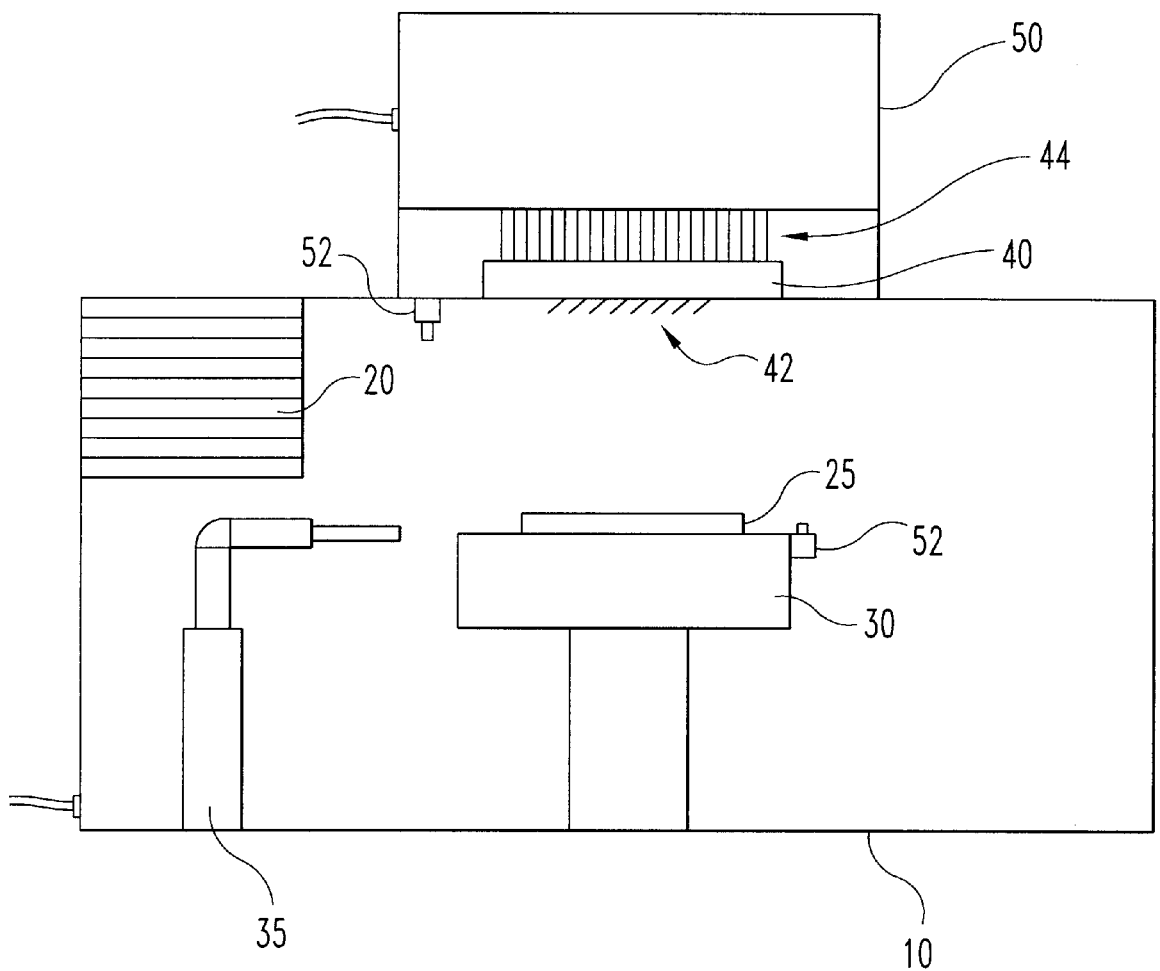
FIG. 1 is a perspective view of exemplary semiconductor test equipment.

For the purposes of promoting an understanding of the principles of the invention, reference will now be made to the embodiments illustrated in the drawings and specific language will be used to describe the same. It will nevertheless be understood that no limitation of the scope of the invention is thereby intended, and alterations and modifications in the illustrated device and method and further applications of the principles of the invention as illustrated therein, are herein contemplated as would normally occur to one skilled in the art to which the invention relates.

FIG. 1 shows a wafer prober 10 according to one example of the present invention. The prober 10 includes a wafer boat 20 where wafers 25 are held prior to and after the testing procedure, a stage 30 which supports the wafer 25 to be tested and a robotic arm 35 which transports the wafer 25 between the boat 20 and the stage 30. Testing is performed by a probe card 40 having a plurality of electrical contacts 42 facing the direction of the wafer 25. The probe card 40 is in electrical contact 44 with a test head 50 which is connected to a computer (not shown). The test head 50 receives test data generated by the computer and passes that test data through the probe card 40 to the wafer 25 being tested. Responses from the wafer 25 are returned through the probe card 40 to the test head 50 which transmits the responses to the computer for analysis.

During the testing procedure, the wafer 25 to be tested is removed from the boat 20 by the robotic arm 35 and placed on the stage 30. The stage 30 is then moved so that the probes 42 of the probe card 40 are in electrical contact with testing contacts (not shown) located on the individual dice 200 on the wafer 25 surface. Proper alignment of the wafer 25 relative to the probe card 40 may be ensured by the use of cameras 52 to guide the stage. Once the testing procedure is completed, the stage 30 is moved to disengage the wafer 25 from the probe card 40 and the robotic arm 35 returns the wafer 25 to the boat 20.

Figure 2:
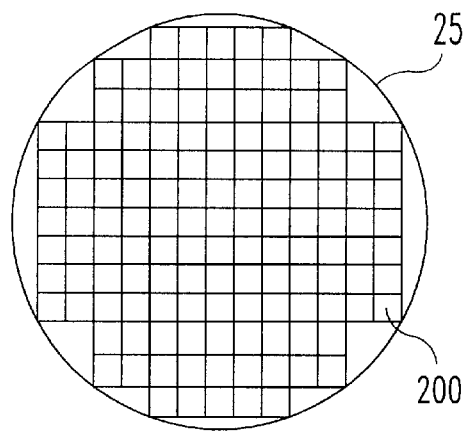
FIG. 2 is a top view of a semiconductor wafer.
Figure 3:
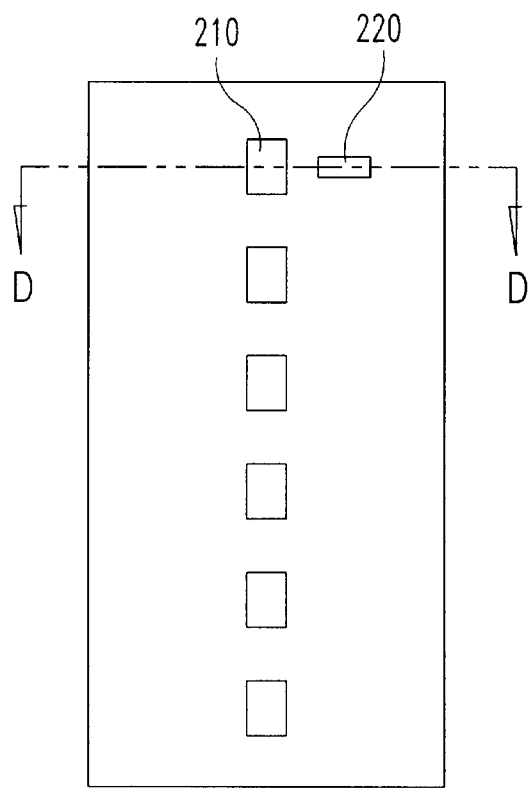
FIG. 3 is a top view of an individual die on a semiconductor wafer.
Figure 4:
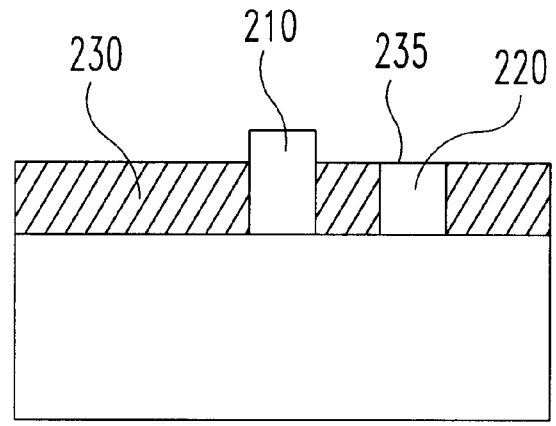
FIG. 4 is a cross-sectional view of the individual die shown in FIG. 3.
Figure 5:
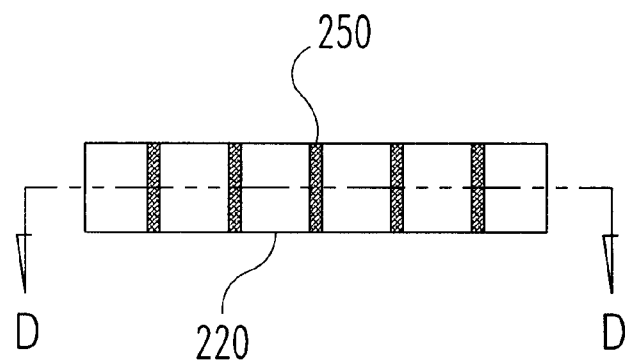
FIG. 5 is a top view of the fuse region of the individual die shown in FIG. 3.
Figure 6:
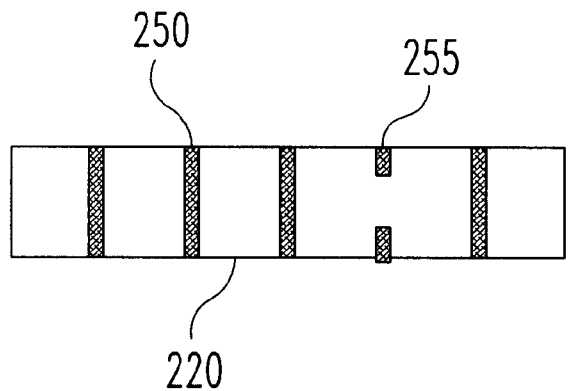
FIG. 6 is a cross-sectional view of the fuse region of the individual die shown in FIG. 5.
Figure 7:
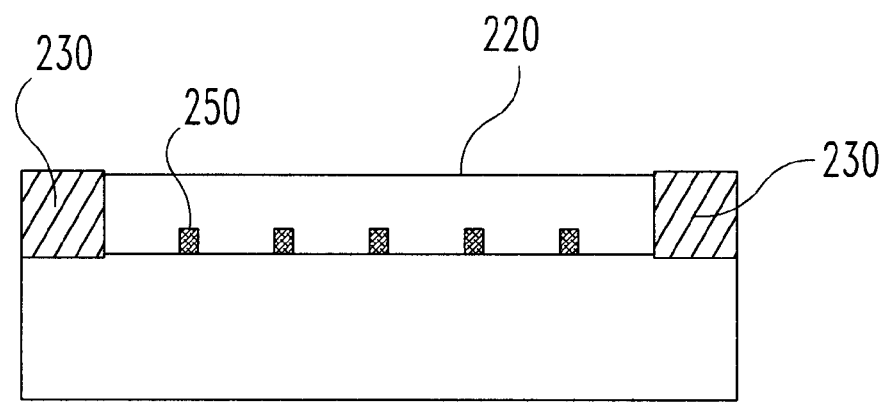
FIG. 7 is a cross-sectional view of the fuse region of the individual die shown in FIG. 5.

FIGS. 2 to 7 illustrate the general design of a typical wafer 25. FIG. 2 shows an unsingulated semiconductor wafer 25 comprised of a plurality of dice 200. The dice may be any type of digital or analog integrated electronic chip, including without limitation semiconductor memories (e.g., dynamic random access memories (DRAM), etc.), digital signal processing units, central processing units, microcontrollers, etc. FIG. 3 is a close up view of a single die 200 element from FIG. 2. The die 200 includes a plurality of terminals 210 for making electrical contact. The die 200 also includes a number of fuse regions 220, only one of which is shown for the sake of clarity. The individual fuses 250 are accessible in these fuse regions 220 as seen in FIG. 7. FIG. 4 shows a cross sectional view along line D in FIG. 3 of a die 200 having a protective covering material 230 over the surface of the die 200. This protective covering material 230 is not necessary and is not present on every wafer 25. If a protective layer 230 is utilized, openings 235 in the fuse region 220 are provided to allow access to the fuses 250.

FIG. 5 is a close up view of a fuse region 220. For purposes of illustration, five individual fuses 250 are shown although fuse regions 220 having more or less individual fuses 250 may be used. When a defective region on a die 200 must be replaced with another nondefective region, this may be accomplished by cutting the individual fuse 235 as seen in FIG. 6.

Figure 8:
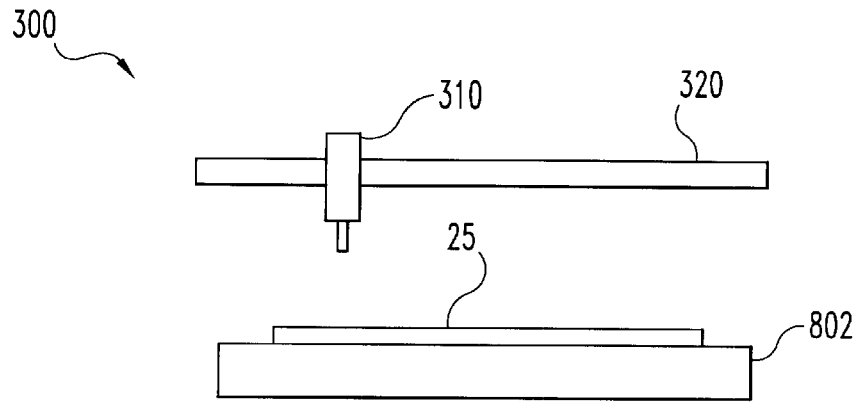
FIG. 8 is a perspective view of an exemplary embodiment according to the present invention.

FIG. 8 shows an exemplary embodiment of the invention. In the example shown, a spray member 300 consists of a spray head 310 movably connected to a spray head support member 320. The spray head 310 may be a nozzle or a series of nozzles, a print head, or any other device capable of delivering a sealing substance in a controlled amount to a particular location. An ink jet print head that delivers dots of ink in the range of about 5–100 microns in diameter may be particularly advantageous because the fuses are typically about 1–10 microns in width and about 5–100 microns in length. The fuses may be spaced from each other as close as a few microns (e.g., 2 microns) or as far apart as hundreds of microns. As known, ink jet print heads typically deliver a stream of ink dots. By properly sizing the ink jet print head, the size of the ink dots may be tailored to the dimensions of the fuse or the fuse area.

The invention is not, however, limited to use of an ink jet print head, much less an ink jet print head that delivers dots of ink with a diameter in the foregoing range, nor is the invention limited to use with fuses having dimensions in the foregoing ranges or spacings between fuses in the foregoing range.

The spray head support member 320 is shown as a single rod, but a spray head support member 320 which is more than one rod or other suitable support structure such as a track or series of tracks may also be used. Moreover, the spray head 310 is preferably moveable in X, Y, and Z directions with respect to the support 802 (discussed below). Alternatively, the support 802 is moveable in X, Y, and Z directions, or the spray head 310 and the support 802 are each moveable in one or more directions such that, with respect to each other, they are moveable in X, Y, and Z direction. The support may also be rotateable.

As seen in FIG. 8, a wafer 25 having fuses (not shown in FIG. 8) to be sealed is placed on a support 802. The spay head 310 and/or the support 802 is then moved such that the wafer 25 is positioned below the spray member 300. This movement may be guided by the use of cameras and suitable control mechanisms (not shown in FIG. 8) that identify particular features on the wafer 25. Once the wafer 25 is moved into position, the sealing process may begin.

A sealing or covering substance is delivered from a storage container (not shown) to the spray head 310, which then applies the sealing substance to cover the exposed fuses (not shown in FIG. 8) on the surface of the wafer 25. The sealing substance may include a variety of possible substances. Suitable sealing substances include those that are compatible with droplet dispensing techniques such as inkjet printing. For example, sealing substances that are similar to inkjet ink in viscosity and drying characteristics are suitable for use with the embodiments disclosed herein. Other desirable characteristics of a sealing substance include the ability to substantially seal out a corrosive environment typical in electronic components and being substantially non-conductive so as not to interfere with normal operation of the die 200. One nonlimiting example of a suitable substance is ink, and particularly ink usable with inkjet or inkjet-like print heads.

Figure 9:
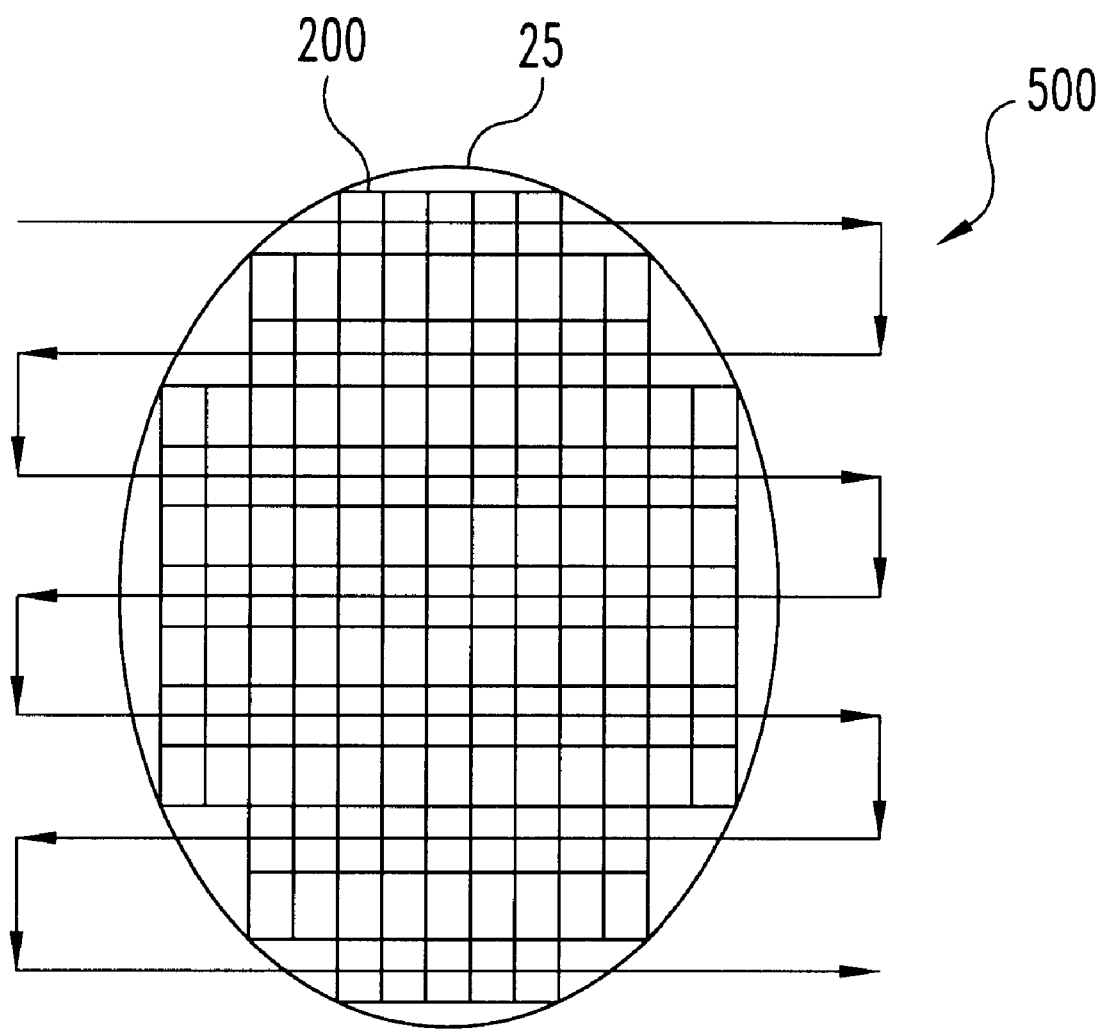
FIG. 9 is a top view of an exemplary spray path that may be used with the embodiment shown in FIG. 8.

The spray head 310 is moved by the spray head support 320 from fuse region 220 to fuse region 220 on the wafer. When the spray head 310 arrives at an exposed fuse region 220, the spray head 310 delivers a predetermined amount of sealing substance to the fuse region 220 before the spray head support 320 moves the spray head 310 to the next exposed fuse region 220. The path 500 followed by the spray head 310 may be in a zigzag pattern as shown in FIG. 9 or in any other suitable pattern which allows the spray head 310 to reach each fuse region 220 to be sealed. The positioning of the spray head 310 may be controlled by a computer and guided by cameras (not shown) or other position detecting devices.

As an alternative to a movable spray head 310, a stationary spray head 310 may be used. In this example, a spray head 310 remains in fixed position while the wafer 25 is positioned below the spray head 310 by the support 802. As the support 802 moves the wafer 25 in a predetermined pattern beneath the spray head 310, the spray head 310 applies the sealing substance to the fuses on the die 200 as previously described.

Figure 10:
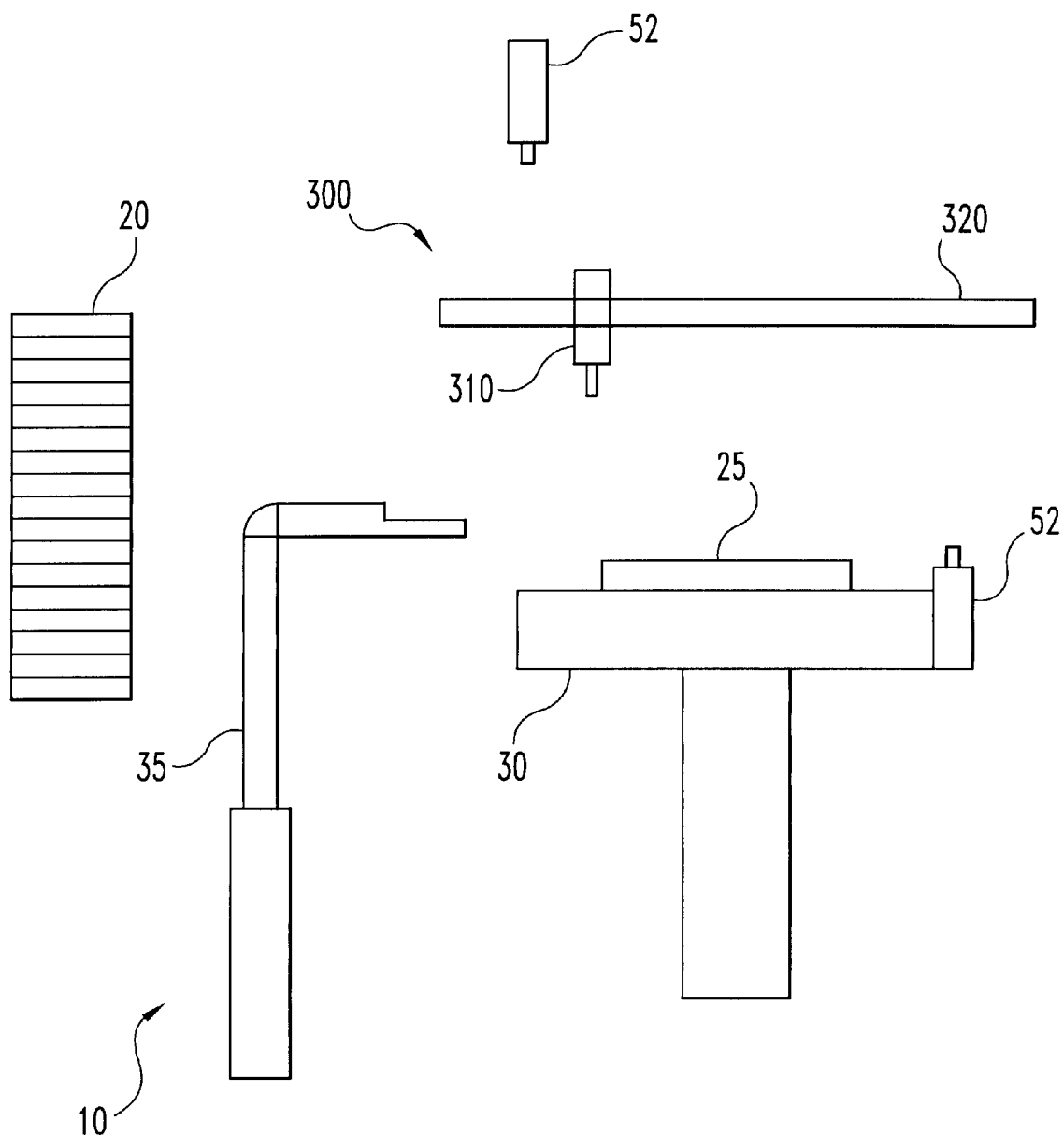
FIG. 10 is a perspective view of an exemplary embodiment according to the present invention.

FIG. 10 shows an exemplary embodiment of the invention in which a probe card in a prober 10 is replaced by a spray member 300, which may be similar to the spray member 300 described above. The wafer 25 may be supported by a stage 30 in the prober 10.

As seen in FIG. 10, a wafer 25 having fuses (not shown in FIG. 10) to be sealed is moved from a boat 20 to a stage 30 by a robotic arm 35. The stage 30 is then moved into a position below the spray member 300. This movement may be guided by the use of cameras 52 which may be mounted, for example, to the stage 30, the spray member 300, or at other suitable locations in the tester 10. Thereafter, the sealing process may proceed generally as described above with respect to FIG. 8. That is, a sealing or covering substance is delivered to the spray head 310, which then applies the sealing substance to cover the exposed fuses 250 on the surface of the wafer 25. The spray head 310 is moved from fuse region 220 to fuse region 220 on the wafer, delivering predetermined amounts of sealing substance to the fuse regions 220. The positioning of the spray head 310 may be controlled by a computer and guided by cameras 52 or other position detecting devices. The cameras 52 normally used to position the stage 30 relative to the probe card 40 may be utilized for correctly positioning the spray head 310.

As an alternative to a movable spray head 310, a stationary spray head 310 may be used. In this example, a spray head 310 remains in fixed position while the wafer 25 is positioned below the spray head 310 by the stage 30. As the stage 30 moves the wafer 25 in a predetermined pattern beneath the spray head 310, the spray head 310 applies the sealing substance to the fuses 250 on the die 200 as previously described. Once the sealing process is complete the stage 30 moves the wafer 25 away from the spray head 310 so the robotic arm 35 may return the wafer 25 to the boat 20.

The present invention also contemplates a combination of a mobile spray member 300 and stage 30 to correctly position the wafer 25 during the sealing process. In one example of such a combination, the stage 30 includes a means for rotating a wafer 25. As the wafer 25 rotates on the stage 30, a spray head 310 capable of linear movement along the support member 320 applies the sealing substance to the fuses 250 on the wafer 25. This combination of a wafer 25 rotating below a linearly moving spray 310 head allows all fuses 250 on the wafer 25 surface to be sealed.

Although FIG. 10 shows a prober where the probe card 40 has been replaced by a spray member 300, a prober 10 which incorporates both a probe card 40 and a spray member 300 may be used. One example of such an arrangement is a prober where after a wafer 25 has been tested and the stage 30 is lowered in the Z-axis direction to disengage the wafer 25 from the probe card 40, a spray member 300 moves into a position between the probe card 40 and the wafer 25. The spray member 300 then performs the sealing process previously described prior to the robotic arm 35 returning the wafer 25 to the boat 20.

Although the foregoing embodiments describe testing and processing of an unsingulated wafer 25, the present invention is also applicable to a singulated die. That is, testing may also be performed on a singulated die and fuses on the singulated die may be activated as needed, after which fuse regions on the singulated die are covered or sealed. For example, initial testing may be performed on the unsingulated wafer 25 as previously described. Once this initial testing is completed and any defects corrected, the wafer 25 may then be singulated into individual dice 200 and each die packaged or otherwise provided with a protective coating. Holes are left in this coating, however, so that the fuses 250 may still be accessed. Alternatively, no packaging or protective coating is applied to the singulated dice. Further testing of the individual dice 200 may be performed and defects corrected as the fuses 250 are still exposed (either through the holes or because no packaging or protective coating has been applied to the dice). Once this additional testing is completed and any defects fixed, the holes 235 allowing access to the fuses 250 may be sealed as previously described. Alternatively, if no packaging or protective coating has been applied to the dice, the exposed fuses my be covered or sealed as described previously described.

As mentioned above, semiconductor devices are typically subjected to a series of tests. Typically, such series of tests begin with some sort of initial gross functionality test followed by one or several more exacting tests. A wide variety of such tests and sequences of tests are known in the field, and the present invention may be used to seal or cover fuses following any one of the tests in any sequence of tests performed on semiconductor devices. For example, the fuses may be covered or sealed following initial gross functionality testing. Alternatively, the fuses may be covered or sealed following later testing. Of course, the further into the sequence of tests that the sealing or covering of fuses occurs, the further into the testing the fuses may be used to replace defective portions of the semiconductor die with nondefective portions. Thus, ideally, the fuses are not sealed or covered until all testing has been completed, allowing the fuses to be used to replace defective portions of the semiconductor die that are determined to be defective during any of the tests in the testing sequence. Of course, however, the invention is not limited only to use after completion of all testing of a semiconductor device.

Figure 11:
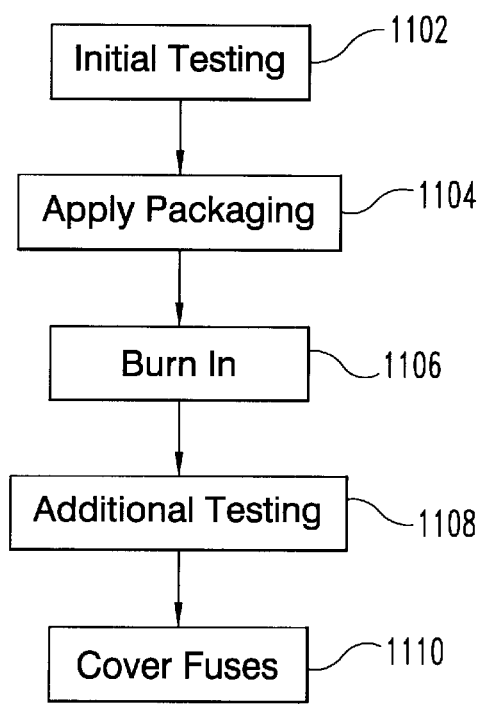
FIG. 11 is flow chart illustrating an exemplary embodiment of the invention.

FIG. 11 illustrates an exemplary sequence in which the fuses on a semiconductor device are covered after all testing has been completed. As shown in FIG. 11, a semiconductor device under goes initial testing at step 1102. Typically, the semiconductor device is a wafer on which has been formed a plurality of dice as shown, for example, in FIG. 2. In such case, the initial testing is sometimes referred to as wafer probing or sorting. As discussed above, fuses on the semiconductor device may be activated to repair dice found to be defective during the initial testing.

After initial testing 1102, packaging is typically applied to the semiconductor device 1104. In some processes, the wafer is singulated into individual dice and the packaging is thereafter applied. Alternatively, the wafer may be left unsingulated and wafer level packaging applied to the dice while still in wafer form. As yet another alternative, no packaging may be applied to the dice, whether they are singulated or not. If packaging is applied, windows (e.g., 220 in FIG. 2) are formed in the packaging, leaving the fuse regions exposed.

Whether in wafer form or singulated into individual dice, and whether packaged or unpackaged, the semiconductor device is next subjected to burn in 1106. As known in the field, burn in involves exercising the semiconductor device while at an elevated temperature. Following burn in, the semiconductor device is subjected to additional testing 1108, which may consist of one or more additional tests run on the semiconductor device. Because the fuses on the semiconductor device are still exposed, fuses may be activated to repair defects found during these additional tests. It should be noted that burn in may itself involve testing the semiconductor device. Thus, the additional testing 1108 may be combined with burn in 1106. After all testing has been completed, the fuses are sealed or covered 1110. It should be noted that the semiconductor wafer may be singulated at any time during the process shown in FIG. 11, including before the initial testing 1102 and after covering the fuses 1110.

Figure 12A:
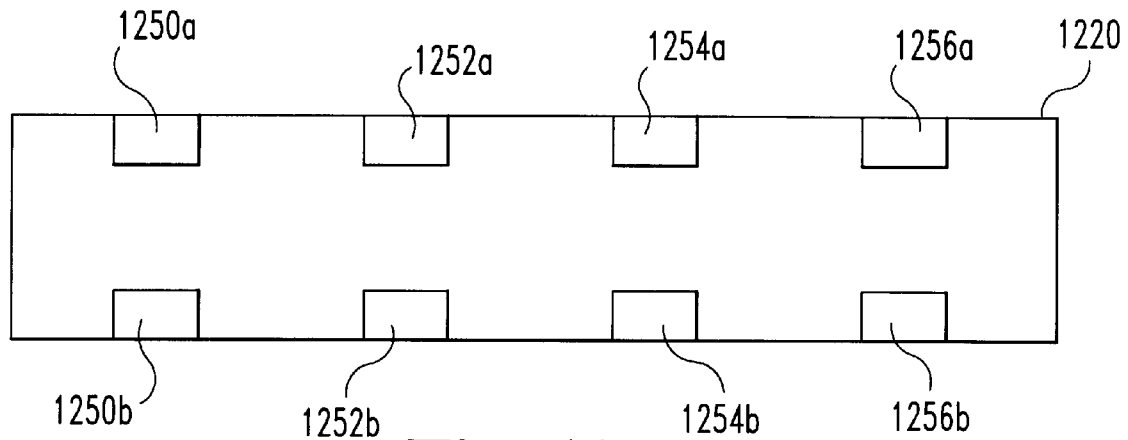
FIGS. 12A and 12B are top views of an exemplary fuse region.
Figure 12B:
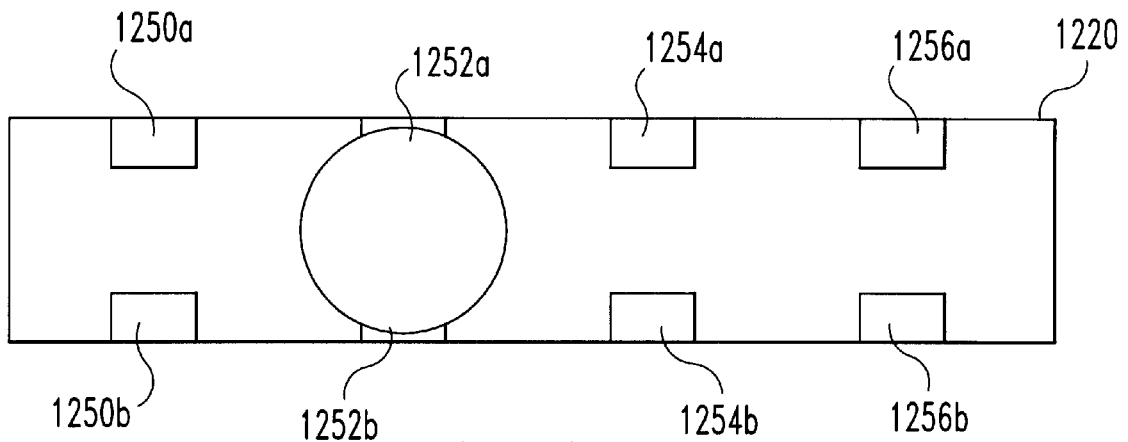

FIGS. 12A and 12B illustrate use of what might be termed "reverse fuses." FIG. 12A illustrates a fuse region 1220 on a semiconductor device (not shown) containing reverse fuses 1250, 1252, 1254, 1256. These reverse fuses are activated by applying a conductive material to electrically connect one half of a reverse fuse with its other half. For example, as shown in FIG. 12B, conductive material 1260 has been applied to activate fuse 1252.

Reverse fuses, such as those shown in FIGS. 12A and 12B, may be used in place of the fuses such as 250 described above. Such fuses are activated not by cutting a fuse (with a laser for example) but by applying conductive material 1260 to the fuse as shown in FIG. 12B. The conductive material 1260 preferably is dispensed in the same manner and has the same properties as described above with respect to a covering or sealing material except that the conductive material is electrically conductive. For example, as described above, the conductive material may be dispensed using an ink jet print head, and as also mentioned above, an ink jet print head may be sized such that the droplets delivered by the ink jet print head correspond to the dimensions of the reverse fuses, which dimensions may generally be on the order of the fuses discussed above. After all of the reverse fuses that are to be activated have been activated, a nonconductive material may be used to cover or seal the fuse region as described above. Using this approach, the laser cutting step can be eliminated, and the repair and overcoating steps may be performed on one piece of equipment. A dispensing system with a single print head capable of dispensing both conductive and non-conductive materials may be used. Alternatively, separate systems may be used for conducting and non-conducting substances.

While the invention has been illustrated and described in detail in the drawings and foregoing description, the same is to be considered as illustrative and not restrictive in character, it being understood that exemplary embodiments have been shown and described and that all changes and modifications that come within the spirit of the invention are desired to be protected. The articles "a", "an", "said" and "the" are not limited to a singular element, and include one or more such elements. The term "semiconductor device" refers to any semiconductor based electronics element including without limitation an unsingulated wafer, singulated dice, or a singulated die, whether packaged or unpackaged. The term "fuse" refers to any fuse whether activated by cutting as shown in FIG. 6 or applying a conductive material as shown in FIG. 12B.

What is claimed is:

1. A method of covering the fuse regions on a semiconductor device, the method comprising:

testing a semiconductor device having exposed fuse regions; and thereafter, positioning said semiconductor device adjacent a spray member being capable of delivering a sealing fluid;

applying said sealing fluid to said semiconductor device to cover said exposed fuse regions.

2. The method of claim 1 further comprising modifying at least one of said exposed fuse regions prior to applying said sealing fluid.

3. The method of claim 1, wherein said semiconductor device comprises an unsingulated wafer.

4. The method of claim 1, wherein said semiconductor device comprises a singulated die.

5. The method of claim 1 wherein said spray member is movably mounted within a prober.

6. The method of claim 5 wherein said spray member moves in an X-axis and Y-axis directions relative to said semiconductor device during said applying step.

7. The method of claim 1, wherein said sealing fluid is applied as a stream of droplets.

8. The method of claim 7, wherein said droplets are of a controlled size.

9. The method of claim 1, wherein said fuses are reverse fuses, said method further comprising applying a conductive fluid to at least one of said reverse fuses.

10. The method of claim 9, wherein said conductive fluid is applied as a droplet to each of said at least one of said reverse fuses.

11. The method of claim 10, wherein each said droplet is sized to correspond to dimensions of said at least one of said reverse fuses.

12. The method of claim 1 wherein said applying act is preceded by the act of singulating a wafer into individual dice.

13. The method of claim 1 wherein said spray member is a print head.

14. The method of claim 13 wherein said sealing fluid is ink.

* * * * *